United States Patent
Kronseder (10) Patent No.: US 8,873,304 B2
(45) Date of Patent: Oct. 28, 2014

(54) INTEGRATED CIRCUITRY, CHIP, METHOD FOR TESTING A MEMORY DEVICE, METHOD FOR MANUFACTURING AN INTEGRATED CIRCUIT AND METHOD FOR MANUFACTURING A CHIP

(71) Applicant: Infineon Technologies AG, Neubiberg (DE)

(72) Inventor: Stephan Kronseder, Schliersee (DE)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 13/625,028

(22) Filed: Sep. 24, 2012

(65) Prior Publication Data

US 2014/0085994 A1   Mar. 27, 2014

(51) Int. Cl.
*G11C 7/10* (2006.01)
*G11C 8/16* (2006.01)

(52) U.S. Cl.
CPC ...................................... *G11C 8/16* (2013.01)
USPC ............ 365/189.04; 365/233.17; 365/185.03; 365/230.03; 365/189.05; 365/189.06

(58) Field of Classification Search
CPC ...... G11C 11/401; G11C 29/50; G11C 16/16; G11C 29/14; G06F 11/1064; G06F 11/1666; G06F 12/0246; G06F 21/78; G06F 3/0688; G11B 19/02
USPC .......... 365/185.03, 230.03, 233.17; 711/103, 711/105, 170
See application file for complete search history.

(56) References Cited

U.S. PATENT DOCUMENTS

2011/0225445 A1*   9/2011   Gower et al. ................. 711/154

* cited by examiner

*Primary Examiner* — Thong Q Le (57) ABSTRACT

In various embodiments an integrated circuit or chip is provided, the integrated circuit including a memory device including a plurality of memory cells, and with the memory cells being configured to store a data content, and a controller being configured to write a predefined data pattern in the memory cells of the memory device, reading the data content of the memory cells, mapping each read data content which corresponds to an expected data content depending on the predefined data pattern to a predefined instruction for the controller, with the predefined instruction causing the controller to carry out a predefined action which is representative for the accurate operation of the memory cells, determining that the memory device operates accurately, if the controller carries out the predefined action, and determining that the memory device does not operate accurately, if the controller does not carry out the predefined action.

26 Claims, 4 Drawing Sheets

Fig. 5

INTEGRATED CIRCUITRY, CHIP, METHOD FOR TESTING A MEMORY DEVICE, METHOD FOR MANUFACTURING AN INTEGRATED CIRCUIT AND METHOD FOR MANUFACTURING A CHIP

TECHNICAL FIELD

Various embodiments relate generally to an integrated circuit or a chip having a memory device and a controller. Further, various embodiments relate generally to a method for testing a memory device, a method for manufacturing an integrated circuit and a method for manufacturing a chip.

BACKGROUND

Today, memory device testing is either done by built in self-test (BIST)-modules, by special test-access modules or by using the central processing unit (CPU) or controller, for example a micro-controller, of an integrated circuit (IC) which contains the memory device.

If BIST is selected, then additional hardware blocks are added to the circuit to speed up memory testing. This is the same for special test-access modules, here also additional hardware blocks and test-pins are required.

In systems housing a CPU or controller the memory device testing can be done by using the CPU. This approach can substitute the BIST logic with the advantage of reducing the overall gate count of the system. However, using the CPU for testing has often the drawback of higher test-time, because usually more than one CPU instruction is needed to verify one data word within the memory device to test.

SUMMARY

In various embodiments an integrated circuit is provided. The integrated circuit has a memory device and a controller. The memory device has a plurality of memory cells. The controller is configured to write a predefined data pattern in the memory cells of the memory device and to read or fetch the data contents of the memory cells. Further, the controller is configured to map each read data content which corresponds to an expected data content depending on the predefined data pattern to a predefined instruction for the controller. The predefined instruction causes the controller to carry out a predefined action which is representative for the accurate operation of the memory cells. Further, the controller is configured to determine that the memory device operates accurately, if the controller carries out the predefined action, and to determine that the memory device does not operate accurately, if the controller does not carry out the predefined action.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
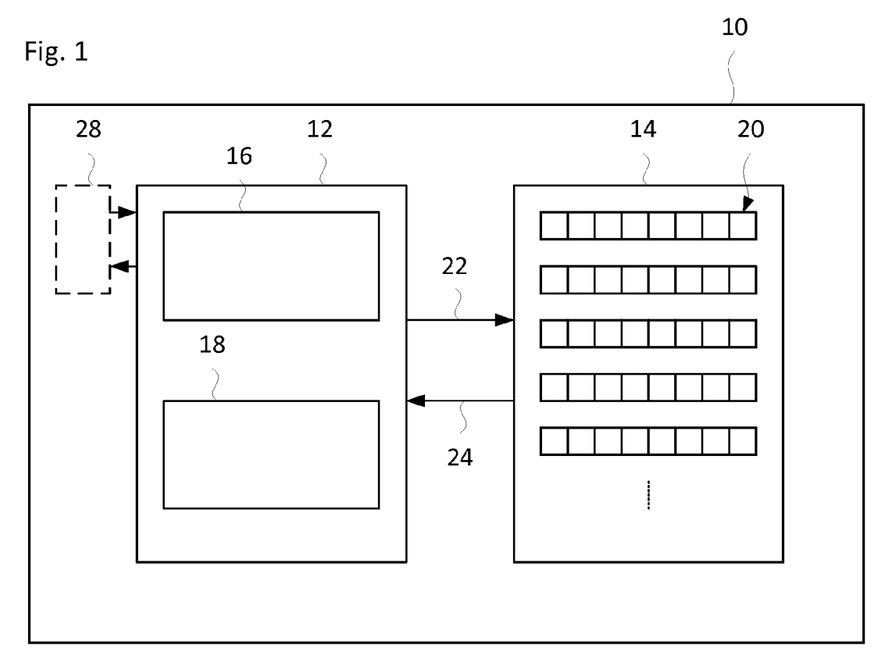
FIG. 1 shows an integrated circuit.

FIG. 1 shows an integrated circuit 10 having a controller 12, for example a micro-controller, and a memory device 14. The integrated circuit 10 may form a chip or may be a part of a chip. The controller 12 may have an internal register 16 for storing data and a controller unit 18 for executing instructions. The controller 12 may further have an arithmetic logic unit (not shown) for carrying out calculations. The data stored in the internal register 16 may be temporary data which are subjected to the calculations, wherein the results of the calculations may also be temporary stored in the internal register 16, or may be instructions which may be executed by the controller 12. Alternatively the controller 12 may have separate registers for temporary data and for instructions, respectively. If the data in the internal register 16 is an instruction the corresponding opcode may be stored in and read from the memory device 14. Alternatively, the opcode may permanently be stored in the controller 12. Further, the instructions may also be stored in the memory device 14. The integrated circuit 10 may be a field-programmable gate array (FPGA). The term "opcode" is the short form for "operation code". An opcode is a number that reflects a machine instruction or instruction for the controller 12. The integrated circuit 10 may have a debug- or test-interface 28 that can be used to control parts or all parts of the integrated circuit via external pins, e.g. JTAG.

The memory device 14 may have a plurality of memory cells 20. Each memory cell 20 may be able to store at least one bit of data and for example may store a logical "one" or a logical "zero". The memory cells 20 may for example form memory cell groups and/or may be arranged in memory cell groups, wherein each memory cell group may store a data content which may for example correspond to one data word. Each data word may e.g. consist of 8, 16, 32 or 64 bit. In other words, each memory cell group may have 8, 16, 32 or 64 memory cells 20 for storing a corresponding data word. In FIG. 1, the memory cells 20 of one memory cell group are arranged in a row and the memory cell groups are arranged one above the other for convenience. However, the memory cells 20 may be arranged differently, e.g. in a matrix form or in another predefined desired pattern.

The controller 12 may execute a write operation 22 on the memory device 14. In various embodiments, the controller 12 may write data, e.g. data content or data words, or instructions from its internal register 16 to the memory device 14. The controller 12 may be able to actress any of the memory cell groups to write data words in the respective memory cell group. Furthermore, the controller 12 may execute a read operation 24 on the memory device 14. In various embodiments, the controller 12 may read data, e.g. data content or data words, or instructions from the memory device 14 to the internal register 16.

According to a memory device test, defined sets of predefined data patterns may be written into the memory device 14 and stored in the memory cells 20 of the memory device 14. Afterwards the data content stored in the memory cells 20 may be read back by the controller 12. The read back operation is needed to verify, if that parts of the integrated circuit 10 needed for carrying out the write operation 22 and the read operation 24 and the memory device 14 are operating accurately.

In the following, some predefined data patterns for testing the memory device 14 will be explained. According to a so called PatternZeros, all bits of all memory cells 20 are set to a logical zero (PatternZeros: '0 . . . 0'). According to a so called PatternOnes, all bits of all memory cells 20 are set to a logical one (PatternOnes: '1 . . . 1'). According to a so called PatternStripes, the bits of the memory cells 20 are set to alternating logical zero and logical ones (PatternStripes: '0101 . . . 0101'). According to a so called PatternStripesInverse, the bits of the memory cells 20 are set to alternating logical ones and logical zeros (PatternStripesInverse: '1010 . . . 1010'). According to a so called PatternCheckerboard the PatternStripes and PatternStripesInverse are combined, wherein each even line of memory cell groups contains the predefined data pattern PatternStripes and each odd line of memory cell groups contains the predefined data pattern PatternStripesInverse. The result is a so-called checkerboard pattern. According to a so called PatternCheckerboardInverse, the PatternStripes and PatternStripesInverse may be combined, wherein each odd line of memory cell groups may contain the predefined data pattern PatternStripes and each even line of memory cell groups contains the predefined data pattern PatternStripesInverse. In this context the terms "odd" and "even" may relate to the physical order according to which the memory cells 20 may be arranged and/or to the numbers of the addresses of the memory cell groups. Alternatively or additionally, any other predefined bit pattern may be used to test the memory cells and/or memory cell groups to guarantee accurate function of the memory cells and/or memory cell groups.

In the following some methods for testing the memory device 14 will be explained which use the above predefined data patterns. The methods will be explained with the help of assembler-code, wherein for the following code examples it is assumed that the controller 12 is an ARM cortex M0 CPU and wherein "cycle" is used as a synonym for one clock cycle with which the corresponding CPU is clocked. As an example, it is assumed that the register R1 is containing the overall test result and therefore has to be initialized to zero before each test. Alternatively, the code may be written in any other machine language or in an interpreter language, such as for example C.

An exemplary code-sequence for testing the memory device 14 with the predefined data pattern PatternZeros is:

TestNext:

| | |
|---|---|
| Ldr | R0, [R6, R7] |
| Orrs | R1, R0 |
| Subs | R7, #4 |
| Bpl | TestNext |

The code-sequence is called "TestNext". According to the first line of the code-sequence, a data word is read from the memory device and is stored in a Register R0, wherein the corresponding opcode is 0x59F0 and wherein two cycles are needed. According to the second line of the code-sequence, a logical OR-operation is carried out on the overall test result stored in the Register R1 with the data word stored in Register R0, wherein the corresponding opcode is 0x4301 and wherein one cycle is needed. According to the third line of the code-sequence, the index is changed such that the next data word of the memory device 14 may be read, wherein the corresponding opcode is 0x3F04 and wherein one cycle is needed. According to the fourth line of the code-sequence it is checked whether all data words or the data content of all memory cell groups of the memory device 14 are read out, wherein the corresponding opcode is 0xD5FB and wherein three cycles are needed. In total, seven cycles are required to test one data word having 32 bits in accordance with this code-sequence.

In the following embodiments, detailed explanation of the single machine code instructions and the corresponding opcodes as given in context with the preceding example is omitted, because they correspond to conventional and widely known instructions and opcodes, respectively.

An exemplary code-sequence for testing the memory device 14 with the predefined data patterns PatternOnes, PatternStripes, or PatternStripesInverse may be:

TestNext:

| | | |
|---|---|---|
| Ldr | R0, [R6, R7] | (2 cycles needed, opcode: 0x59F0) |
| Eors | R0, R5 | (1 cycle needed, opcode: 0x4068) |
| Orrs | R1, R0 | (1 cycle needed, opcode: 0x4301) |
| Subs | R7, #4 | (1 cycle needed, opcode: 0x3F04) |
| Bpl | TestNext | (3 cycles needed, opcode: 0xD5FA) |

In total 8 cycles are required to test one data word having 32 bits in accordance with the above sequence.

An exemplary code-sequence for testing the memory device 14 with the predefined data patterns PatternCheckerboard or PatternCheckerboardInverse may be:

| | | |
|---|---|---|
| Ldr | R0, [R6, R7] | (2 cycles needed, opcode: 0x59F0) |
| Tst | R7, R3 | (1 cycle needed, opcode: 0x421F) |
| Beq | EvenWordLine | (1/3 cycles needed, opcode: 0xD001) |
| Eors | R0, R4 | (1 cycle needed, opcode: 0x4060) |
| B | WordTestDone | (3 cycles needed, opcode: 0xE000) |

EvenWordLine:

| | | |
|---|---|---|
| Eors | R0, R5 | (1 cycle needed, opcode: 0x4068) |

WordTestDone:

| Orrs | R1, R0 | (1 cycle needed, opcode: 0x4301) |
|------|--------|----------------------------------|
| Subs | R7, #4 | (1 cycle needed, opcode: 0x3F04) |
| Bpl  | TestNext | (3 cycles neede, opcode: 0xD5F6) |

In total, (13+12)/2=12.5 cycles are required to test one data word having 32 bits.

It can be seen that the required execution cycles can be tracked down to two main contributors: Firstly, each read data word has to be evaluated and somehow the result has to be stored. Secondly, the correct addressing of all data words to test requires a loop-construction that consumes a lot of time due to changing the index and the conditional branch, because conditional branches generally consume a lot of time.

Figure 2:
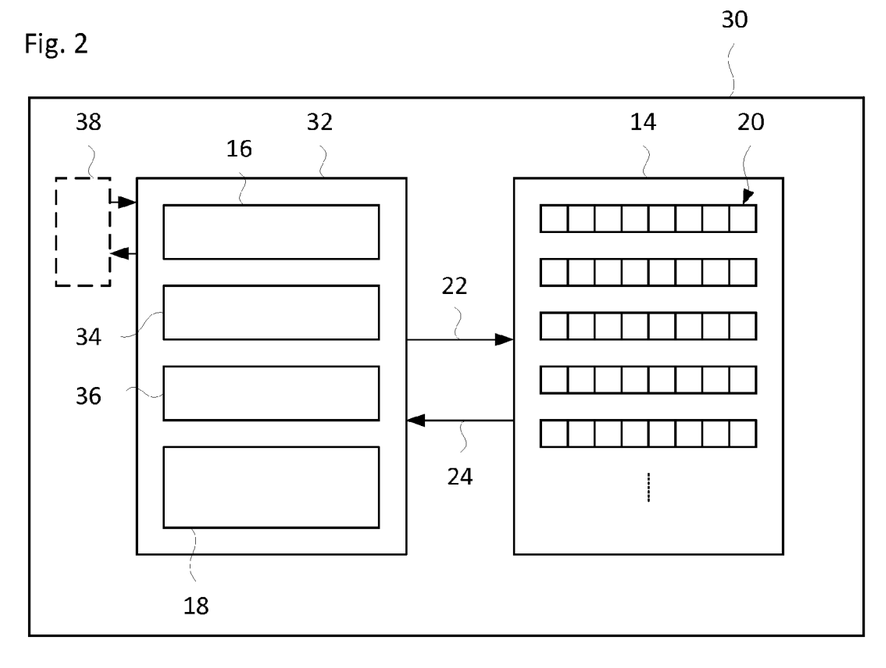
FIG. 2 shows an embodiment of an integrated circuit or chip.

FIG. 2 shows an embodiment of an integrated circuit 30 having a controller 32 and the memory device 14. The integrated circuit 30 may form a chip or may be a part of a chip. The integrated circuit 30, the controller 32, the memory device 14 and/or the corresponding chip may widely correspond to the integrated circuit 10, the controller 32, the memory device 14 and/or the corresponding chip as shown in FIG. 1 and as described above. However, in addition to the above explained elements and functions of the conventional controller 12, the controller 32 according to FIG. 2 has a first register (TriggerOpCode) 34 and a second register (MappedOpCode) 36. The registers 34, 36 may be for example any kind of memory being able to store corresponding look-up-tables. Further, there may be arranged further registers, for example pairs of registers, for example two pairs of registers. For example, when using the PatternCheckerboard or PatternCheckerboardInverse as predefined data pattern, two pairs of registers may be advantageous. Alternatively or additionally, the integrated circuit 30 may have a debug- or test-interface 38 that can be used to control parts (e.g. access to 34 and 36, for example for mapping the opcodes) or all parts of the integrated circuit via external pins e.g. JTAG.

The first register 34 and the second register 36 enable to temporarily modify the meaning of a fetched opcode and/or of data words or opcodes stored in the internal register 16. The first register 34 and the second register 36 assign this temporary exchange of that meaning. By way of example, the first register 34 may be used to define which fetched opcode has to be replaced and the second register 36 can be used to define the opcode that has to be executed for the case that an expected opcode or an expected data word was detected. In the following, it will be described how the integrated circuit 30 according to FIG. 2 may be used to test for example one 32 Bit word within just two clock cycles.

The first register 34 and the second register 36 and/or the mapping of the opcode or changing of the meaning of the opcode and/or the interpretation of the fetched or read data words as an opcode may decrease the overall needed test-time compared to conventional testing methods. The first register 34 and the second register 36 allow a temporary mapping of instruction(s) and/or data fetched from the memory device 14 to other instruction(s) and/or data. This enhancement may be used to implement a memory test that can test data words, for example in the size of the target CPU opcode within the memory device 14 with only one clock cycle.

The first register 34 and the second register 36 allow to map read or fetch data content. For example, when using the predefined data pattern PatternZeros, the corresponding data word of an accurate memory cell 20 is "0x0000" which corresponds to an opcode "movs r0,r0" which may be mapped to an opcode for increasing a counter value, for example opcode "adds R0,#1".

Furthermore, for testing the memory device 14, the predefined data pattern PatternZeros may be written to the memory device 14 and thus all memory cells are set to a logical zero. The memory device 14 may be "executed" by the controller 32 from its start address to its end address. In other words, all data words read from the memory device 14 may be interpreted as opcodes for the controller 32, wherein for example the data word "0x0000" is executed as "adds R0,#1".

In the end, the counter value only has to be cross-checked against a pass-value to see, if the memory device 14 operates accurately. The pass-value is the maximum number of all data words of the memory device 14, if the counter value was set to zero at the start of the test.

The data word corresponding to a line of the predefined data pattern PatternOnes is "0xFFFFFFFF", the data word corresponding to a line of the predefined data pattern PatternStripes is "0x55555555" and the data word corresponding to a line of the predefined data pattern PatternStripesInverse is "0xAAAAAAAA" which is assigned to different opcodes and/or instructions. In the following, the current interpretation for these data words as opcodes can be seen for CortexM0:

Data word 0x0000=Opcode "movs r0,r0"
Data word 0xFFFFFFFF=Opcode undefined
Data word 0x5555=Opcode "strb r5,[r2,r5]"
Data word 0xAAAA=Opcode "add r2,sp,#0x2A8"

In the following, the above data words are referred to as expected data content or expected data words and the above opcodes are referred to as expected data content or expected instruction or original instruction.

All these expected data words or expected opcodes may be mapped to a predefined opcode, e.g. to the opcode "adds R0,#1", to perform all mentioned test-cases. To overcome the problem of the checkerboard patterns two sets of TriggerOpCode/MappedOpCode are required as both the "0x5555" and "0xAAAA" data have to be mapped to other instructions. If there are two pairs of registers (TriggerOpCode/MappedOpCodes), an additional mechanism may be added to define a sequence how to activate/deactivate specific sets of TriggerOpCode/MappedOpCodes in a deterministic way for example for changing pattern handling, what may be advantageous for example when checkerboard pattern are used as predefined data patterns in order to avoid the compensation of the effect of not executing the predefined instruction.

Following time reductions can be achieved for:

| PatternZeros: | approx.: 70% |
|---|---|
| PatternOnes/PatternStripes/PatternStripesInverse: | approx.: 75% |
| PatternCheckerboard/PatternCheckerboardInverse: | approx.: 84% |

For returning back to the normal program flow after all memory cell groups have been tested there are different ways and depending on the current system architecture.

In various embodiments a "return" instruction is written in last memory cell group of the memory device 14, for example when writing the predefined data pattern in the memory cells 20. In this case, it may be ensured that the last memory cell group has been tested before and works accurately.

In various embodiments, MMU (memory managing unit) or trap functions may be used to get into a memory-out-of space exception: If a fetch to non available memory address is done, then the exception vector can be used to catch up program execution to finish the test. This means, if the end of the memory device 14 is reached, then accessing the next value will automatically raise an exception which leads to the end of the test.

The following first table 1 shows a pass case for testing the memory device 14 with the temporary changed opcode meaning and following second table 2 shows a fail case for testing the memory device 14 with the temporary changed opcode meaning.

Both tests are started with a register R0, for example a counter register, for counting the counter value initialized with the counter value zero. For the pass case each data content is temporarily interpreted as the opcode "adds R0,#1" which is the predefined instruction in this case, therefore at the end of the test the counter R0 contains the value of "0x0008", what is the expected pass-case value at the memory end.

In contrast to this, the fail case shows one entry with an error corresponding to the data word "0x0001". This data content is not mapped to another instruction or opcode, because the data content does not correspond to the expected data content. Therefore, one execution of the predefined instruction, for example to increment the counter value, gets lost. This can be seen in the end result within R0, which is 0x0007 for this particular example.

TABLE 1

(pass case):

| Address offset: | Part of Memory: | Original opcode: | Mapped to: | Counter in R0: |
|---|---|---|---|---|
| 0x000E | 0x0000 | movs R0, R0 → | adds R0, #1 | 0x0008 |
| 0x000C | 0x0000 | movs R0, R0 → | adds R0, #1 | 0x0007 |
| 0x000A | 0x0000 | movs R0, R0 → | adds R0, #1 | 0x0006 |
| 0x0008 | 0x0000 | movs R0, R0 → | adds R0, #1 | 0x0005 |
| 0x0006 | 0x0000 | movs R0, R0 → | adds R0, #1 | 0x0004 |
| 0x0004 | 0x0000 | movs R0, R0 → | adds R0, #1 | 0x0003 |
| 0x0002 | 0x0000 | movs R0, R0 → | adds R0, #1 | 0x0002 |
| 0x0000 | 0x0000 | movs R0, R0 → | adds R0, #1 | 0x0001 |

TABLE 2

(fail case, one word at address "0x0008" contains a data word unequal expected data word "0x0000":

| Address offset: | Part of Memory: | Original opcode: | Mapped to: | Counter in R0: |
|---|---|---|---|---|
| 0x000E | 0x0000 | movs R0, R0 → | adds R0, #1 | 0x0007 |
| 0x000C | 0x0000 | movs R0, R0 → | adds R0, #1 | 0x0006 |
| 0x000A | 0x0000 | movs R0, R0 → | adds R0, #1 | 0x0005 |
| 0x0008 | 0x0001 | movs R1, R0 |  | 0x0004 |
| 0x0006 | 0x0000 | movs R0, R0 → | adds R0, #1 | 0x0004 |
| 0x0004 | 0x0000 | movs R0, R0 → | adds R0, #1 | 0x0003 |
| 0x0002 | 0x0000 | movs R0, R0 → | adds R0, #1 | 0x0002 |
| 0x0000 | 0x0000 | movs R0, R0 → | adds R0, #1 | 0x0001 |

Thus, with the integrated circuit 30 in accordance with various embodiments, it is possible to temporarily modify the interpretation of fetched and executed opcodes. This may mean that the currently fetched opcode is cross-checked against one (or more) trigger values or an expected data content or an expected instruction before being executed. For the case that the current or original opcode matches with one of the trigger values, the current or original opcode may be dynamically replaced with another predefined instruction or opcode (mapped opcode).

By doing this, it is possible to use the controller 32 to step through the memory device 14 to test data word by data word and/or one memory cell group after the other. This may for example be done in a linear way. Each fetched data word or opcode may then be interpreted for example to increase the counter value. In the end, the counter value may be used to verify whether all read data words contained the same correct value depending on the predefined data pattern written to the memory device 14 before. For the case of memory failures, the counter value will be not correct.

This may mean that only one opcode is needed to test one data word in the size of the selected opcode within the tested memory device 14. The trigger-values and the replacement-values should be changed by the controller 32 or by any debug-interface 38 as needed, wherein the trigger-values are the expected data words or expected opcodes and wherein the replacement-values are the predefined instructions or data words.

Thus, the integrated circuit 30 may have the memory device 14 and the controller 32. The memory device 14 may have the plurality of memory cells with the memory cells may being arranged in memory cell groups, and with each memory cell group being configured to store the data content in the memory cells 20 of the respective memory cell group. The data content of one group of memory cells is in various embodiments a data word and/or a data Byte. In various embodiments, each data word of the memory cell groups may be formed of the data bits of the memory cells 20 of the respective memory cell group.

The controller 32 and/or chip may be configured to test the memory cells 20 of the memory device 14 by writing the predefined data pattern into the memory cells 20 of the memory device 14, for example one of the above mentioned predefined data patterns, by reading the data contents of the memory cell groups, by mapping each read data content to a predefined instruction for the controller 32, if a predefined criterion is fulfilled. In various embodiments the predefined criterion may be fulfilled if the read data content corresponds to the expected data content.

In various embodiments, the predefined data pattern may consist of logical zeros in all memory cells 20, logical ones in all memory cells 20 or logical zeros and logical ones alternating over all memory cells 20. In various embodiments, the predefined data pattern may consist of test data words with each test data word consisting of logical zeros, logical ones or alternating logical zeros and logical ones. The expected data content may depend on the predefined data pattern and may correspond to one line and/or data word of the predefined data pattern. In various embodiments, the expected data content may correspond to an original instruction, wherein the expected data content and/or the read data word may be interpreted as the original instruction. The expected instruction and/or the expected data content may be expected because of the predefined data pattern and for example may correspond to one data word of the predefined data pattern.

The predefined instruction may cause the controller 32 to carry out an action which is representative for the accurate operation of the memory cells 20 of the corresponding memory cell group. In other words, the controller 32 may execute the predefined instruction and the execution of the predefined instruction may lead to an action which is representative for the accurate operation of the memory cells 20 of the corresponding memory cell group.

Thus, the mapping of the read data content to the predefined instruction may include an interpreting of the read data content as an original instruction for the controller 32 and mapping the original instruction to the predefined instruction, if the original instruction fulfills the predefined criterion. In other words, each read data word may be interpreted as the original instruction for the controller and the original instruction may be mapped to the predefined instruction, if the original instruction corresponds to an expected instruction.

In various embodiments, the predefined criterion may be for example that the original instruction corresponds to the expected instruction, which is expected because of the predefined data pattern written to the memory cells 20. Thus, an action in accordance with the predefined instruction may be carried out by the controller 32 each time the original instruction is mapped to the predefined instruction. Thus, in various embodiments the predefined instruction may be executed each time the original instruction corresponds to the expected instruction or the expected data word. In various embodiments, the predefined instruction may cause the controller 32 to increment the counter value. Alternatively the predefined instruction may change an other result-pattern or state-indicator. For example, the predefined instruction my change a state-indicator that changes from initial pass to fail state. In the end the state-indicator can be evaluated.

The controller 32 may further be configured to test the memory cells 20 of the memory device by determining that the memory device operates accurately, if the controller 32 carried out the predefined instruction for all read memory cell-groups, and by determining that the memory device 14 does not operate accurately, if the controller 32 did not carried out the predefined instruction for all read memory cell groups. The determining whether the memory device 14 operates accurately in various embodiments includes comparing the final counter value with the number of memory cell groups of the memory device 14.

Figure 3:
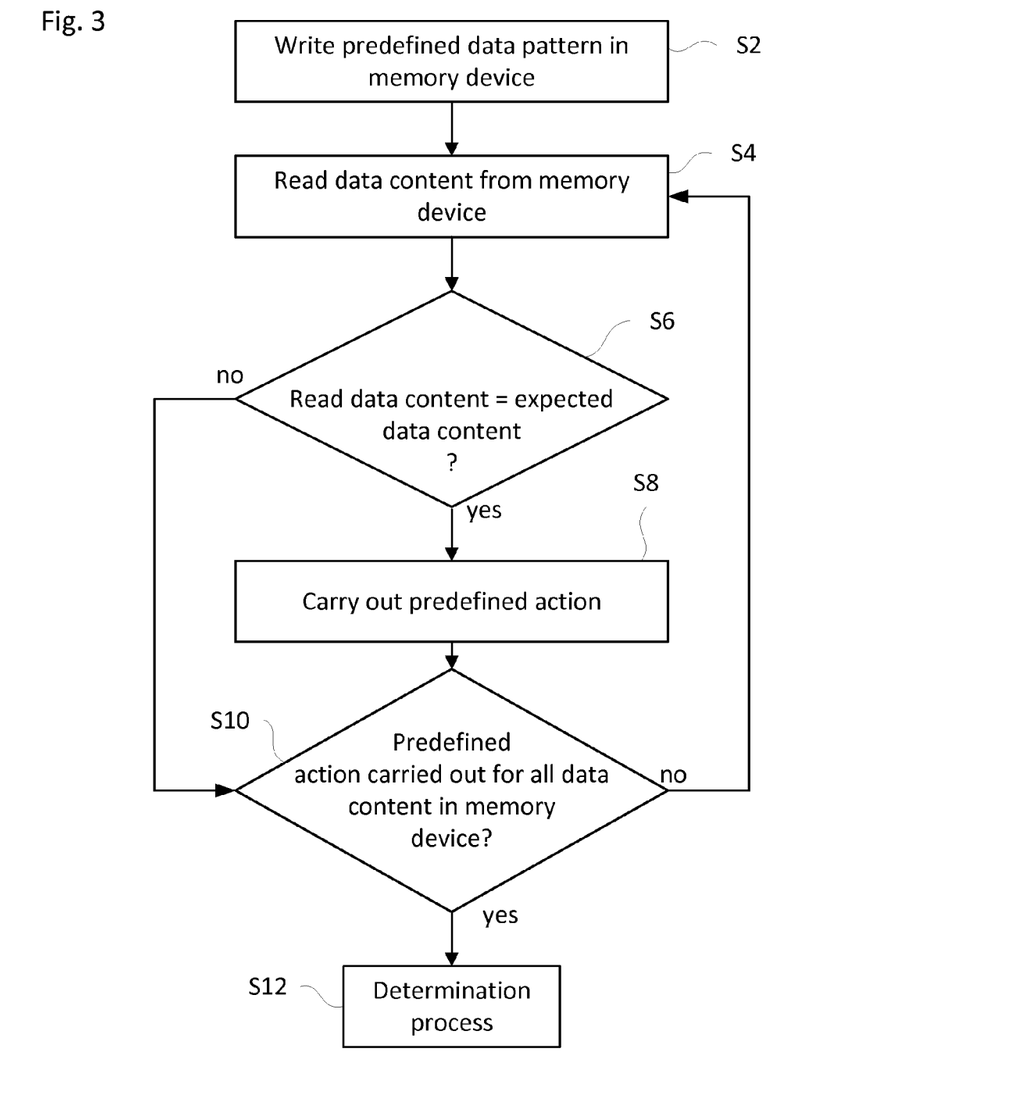
FIG. 3 shows a flowchart of an embodiment of a method for testing a memory device.

FIG. 3 shows a flowchart of an embodiment of a method for testing a memory device of an integrated circuit, for example the memory device 14 of the integrated circuit 30. The method may include:

In S2, the predefined data pattern may be written into the memory cells 20 of the memory device, for example one of the above predefined data patterns. In various embodiments, the writing of the predefined data pattern into the memory cells 20 may correspond to writing logical zeros into all memory cells 20, writing logical ones into all memory cells 20 or writing alternating logical zeros and logical into the memory cells 20. Alternatively, any other data pattern, which may be written in the memory cells, may be used. For example, there are also other specific patterns to do effective memory testings (e.g. MARCH tests), for example:

> "Fill from low bit address to high bit address with ‚1'"
> PatternFill1up_0: '1000 . . . 0'
> PatternFill1up_1: '1100 . . . 0'
> PatternFill1up_2: '1110 . . . 0'
> . . .
> PatternFill1up_n: '1111 . . . 1'
> or
> "Fill from high bit address to low bit address with ‚1'"
> PatternFill1down_0: '0 . . . 0001'
> PatternFill1down_1: '0 . . . 0011'
> PatternFill1down_2: '0 . . . 0111'
> PatternFill1down_3: '0 . . . 1111'
> . . .
> PatternFill1down_n: '1 . . . 1111'
> or
> "Fill from low bit address to high bit address with ‚0'"
> PatternFill0up_0: '0111 . . . 1'
> PatternFill0up_1: '0011 . . . 1'
> PatternFill0up_2: '0001 . . . 1'
> . . .
> PatternFill0up_n: '0000 . . . 0'
> or
> "Fill from high bit address to low bit address with ‚0'"
> PatternFill0down_0: '1 . . . 1110'
> PatternFill0down_1: '1 . . . 1100'
> PatternFill0down_2: '1 . . . 1000'
> PatternFill0down_3: '1 . . . 0000'
> . . .
> PatternFill0down_n: '0 . . . 0000'

In S4, the data content and/or data word of one of the memory cell groups may be read out or fetched.

In S6, the read data content or data word may be compared with an expected data content or an expected data word, respectively. In various embodiments, it may be checked whether the read data content or data word is the expected data content or the expected data word, respectively. If the condition of S6 is fulfilled, the method may proceed in S8. If the condition of S6 is not fulfilled, the method may proceed in S10.

In S8, the predefined instruction may be executed. The predefined instruction may cause the controller 32 to carry out a predefined action which is representative for the accurate operation of the memory cells 20 of the corresponding memory cell group. In various embodiments, the predefined action is for example the incrementing of the counter value.

S6 and S8 may correspond to the mapping of the read data content and/or data word to the predefined instruction, because the data content and/or data word are read or fetched and the predefined instruction is executed. In various embodiments, the mapping of the read data content to the predefined instruction may correspond to an interpreting of the read data content as the original instruction for the controller 32 and to a mapping of the original instruction to the predefined instruction, if the original instruction fulfills the predefined criterion, e.g. if the original instruction corresponds to an expected instruction.

In S10, it may be checked as to whether the predefined instruction has been executed out for all data words and/or all the data content and/or all memory cell groups of the memory device 14. In various embodiments, the current counter value may be compared to the maximum number of memory cell groups of the memory device 14. Alternatively, an overall result-pattern or overall state-indicator may be checked against a criterion reflecting the accurate operation of the memory device. If the condition of S10 is fulfilled, the method may proceed in S12. If the condition of S10 is not fulfilled, the method may proceed in S4 and the next data content and/or data word of the memory device 14 may be read out. S10 may be seen as a trigger-function for exiting the loop from step S10 to S4. As an alternative for getting out of the loop from S10 to S4, as explained above, in various embodiments, MMU or trap functions may be used to get into a memory-out-of space exception. For example, if a fetch to non available memory address is done, then the exception vector can be used to catch up program execution to exit the loop and come to the finish of the test. This means, if the end of the memory device 14 is reached, then accessing the next address will automatically raise an exception which leads to the determination process of the test.

In S12, a determination process may be carried out which determines whether the memory device 14 operates accurately. It may be determined that the memory device 14 operates accurately, if the controller 32 carried out the predefined action for all read memory cell-groups. It may be determined that the memory device 14 does not operate accurately, if the controller 32 did not carried out the predefined action for all read memory cell-groups. For example, in S12, the final counter value may be compared with the maximum number of memory cell groups of the memory cell device 14. If the final counter value corresponds to the maximum number of memory cell groups, it may be determined that the memory device 14 operates accurately. If the final counter value is unequal to the maximum number of memory cell groups, it may be determined that the memory device 14 does not operate accurately, because the predefined instruction has not been executed for all memory cell groups, because at least one data content did not correspond to the expected data content.

Figure 4:
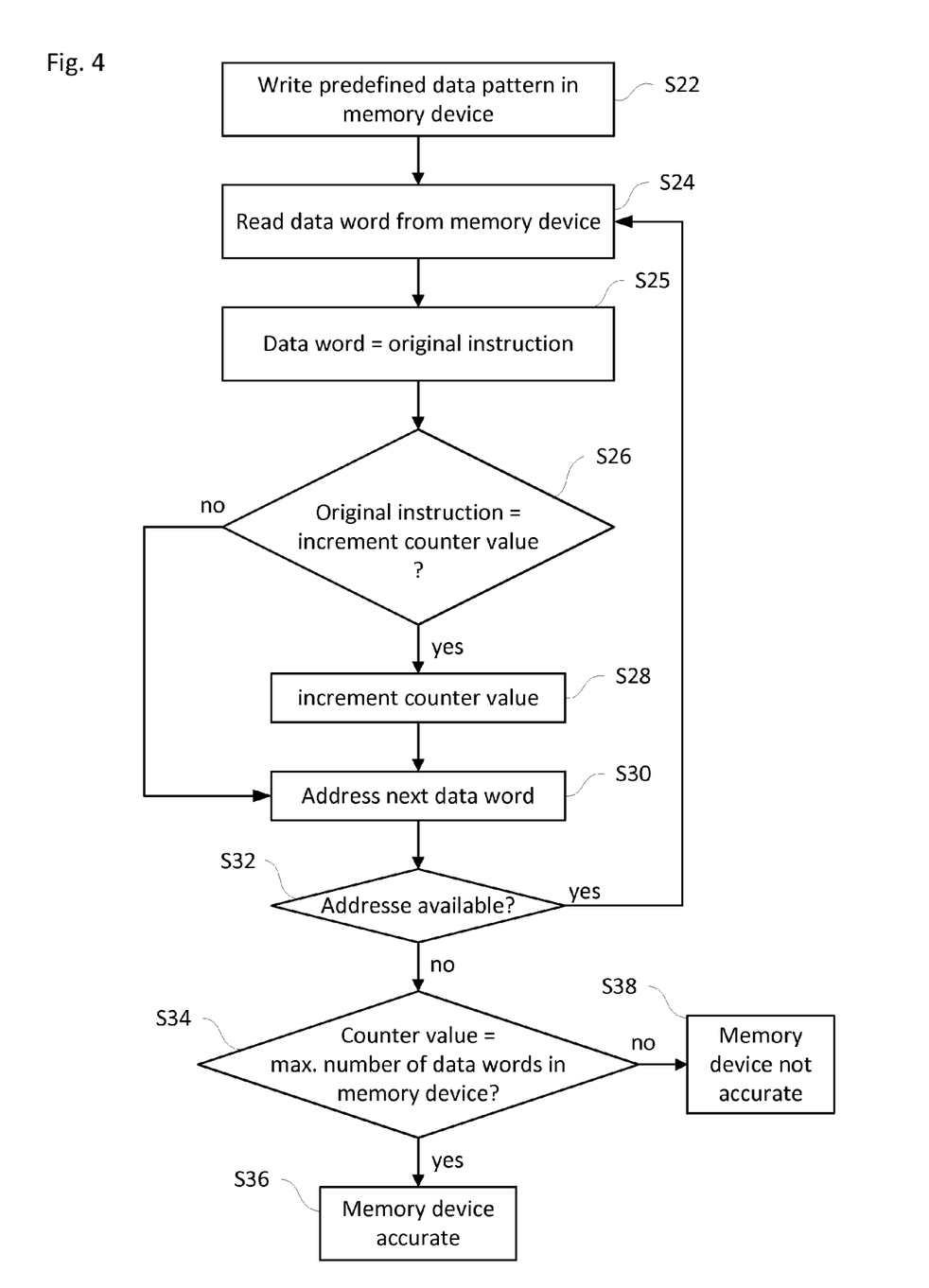
FIG. 4 shows a flowchart of an embodiment of a method for testing a memory device.

FIG. 4 shows a flowchart of a method for testing a memory device of a chip, for example the memory device 14 of the chip having the integrated circuit 30. The method may include:

In S22, the test data words corresponding to the predefined data pattern may be written into the memory cell groups of the memory device 14. In various embodiments, the test data words may be formed by logical zeros, logical ones or by alternating logical zeros and logical ones. Alternatively, any other data pattern may be written into all data words needed for proper testing.

In S24, one of the data words stored in the memory cell groups may be read.

In S26, the read data word may be interpreted as an original instruction for the controller 32 and it may be checked whether the original instruction corresponds to the expected instruction, for example to one of the opcodes "movs r0,r0", "strb r5,[r2,r5]" or "add r2,sp,#0x2A8" or to an undefined opcode. If the condition of S26 is not fulfilled, the method may proceed in S30 and the next data word may be read from the next memory cell group. If the condition of S26 is fulfilled, the method may proceed in S28.

In S28, the predefined instruction, which is for example the opcode "adds R0,#", is executed, what in this case leads to an incrementing of the counter value stored in register R0. S26 and S28 may be seen as a mapping of the original instruction to the predefined instruction, because the original instruction is read and the predefined instruction is executed.

In S30, the next memory cell group containing the next data word to test may be addressed.

In S32, it may be checked whether the address of the next memory cell is available or whether there is a memory cell group having the corresponding address. If the condition of step S32 is fulfilled, the method may proceed in step S24 and the next data word may be read from the next memory cell group. If the condition of S32 is not fulfilled, the method may proceed in S34. In various embodiments, the addressing of a non available memory cell group may automatically lead into a memory-out-of space exception. For example, if a fetch to non available memory address is done, then the exception vector can be used to catch up program execution to exit the loop from S32 to S24 and come to the finish of the test, which for example starts at S34. This means, if the end of the memory device 14 is reached, then accessing the next address will automatically raise an exception which leads to the determination process of the test.

In S34, S36 and S38 it may be determined whether the memory device 14 operates accurately. For example, it may be determined that the memory device 14 operates accurately, if the controller 32 executed the predefined instruction for all read memory cell-groups and for example incremented the counter value for all read data words. Further, for example, it may be determined that the memory device 14 does not operate accurately, if the controller 32 did not execute the predefined instruction for all read memory cell group and for example did not increment the counter value for all read data words.

In various embodiments, in S34, the final counter value may be compared with the maximum number of memory cell groups of the memory device 14. In other words, it may be checked whether the current or final counter value corresponds to the maximum number of data words in the memory device 14. If the condition of S34 is fulfilled, the method may proceed in S36. If the condition of S34 is not fulfilled, the method may proceed in S38.

In S36, it may be determined that the memory device 14 operates accurately.

In S38, it may be determined that the memory device 14 does not operate accurately.

The above explained methods for testing the memory device 14 may also be seen as methods for testing the integrated circuit 30 and/or the corresponding chip, because also a proper function of the controller 32 and, in case, of further electronic elements of the integrated circuit 30 may be required to get a positive test result. For example, the controller 32 has to accurately write and read the data content to and from the memory device 14.

Figure 5:
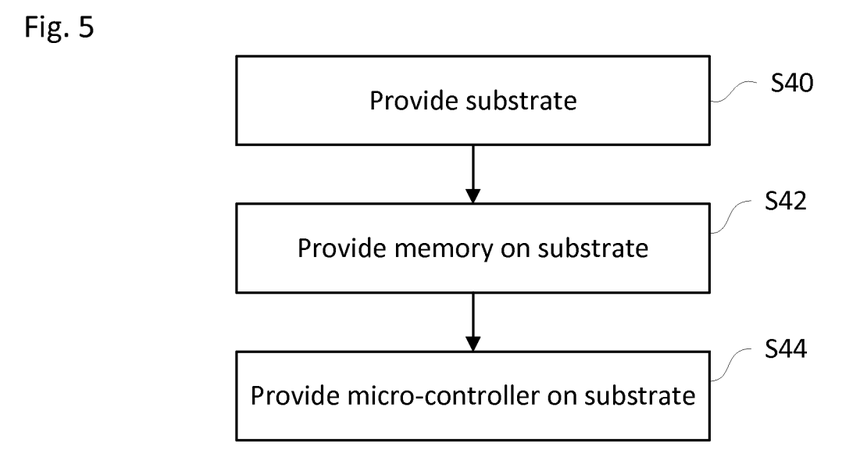
FIG. 5 shows a flowchart of an embodiment of a method for manufacturing an integrated circuit or chip.

FIG. 5 shows a method for manufacturing the integrated circuit 30 and/or the corresponding chip. The method may include:

In S40 a substrate may be provided. The substrate may be formed by a semiconductor material.

In S42, the memory device 14 may be formed on the substrate. In various embodiments, the plurality of memory cell groups are formed, with each memory cell group having the memory cells 20, wherein the memory cell groups are configured such that each of the memory cell groups is able to store the data content and/or one of the data words in the memory cells of the respective memory cell group.

In S44, the controller 32 may be formed on the substrate. The controller 32 may be configured such that it is able to test the memory cells 20 of the memory device 14. In various embodiments, the controller 32 may be configured such that it is able to write the predefined data pattern and/or the test data words in the memory cells 20 of the memory device 14 and to read or fetch the data contents of the memory cell groups. Further, the controller 32 may be configured such that it is able to map each read data content which corresponds to the expected data content depending on the predefined data pattern, to the predefined instruction for the controller 32, with the predefined instruction causing the controller 32 to carry out the predefined action which is representative for the accurate operation of the memory cells 20 of the corresponding memory cell group. Alternatively or additionally the controller 32 may be configured such that it is able to interpret each read data word as the original instruction for the controller 32 and to map the original instruction to the predefined instruction, if the original instruction corresponds to the expected instruction and to carry out the action in accordance with the predefined instruction each time the original instruction is mapped to the predefined instruction. Further, the controller 32 may be configured such that it is able to determine that the memory device 14 operates accurately, if the controller 32 carried out the predefined action or executed the predefined instruction for all read memory cell groups, and to determine that the memory device 14 does not operate accurately, if the controller 32 did not carry out the predefined action or did not execute the predefined instruction for all read memory cell groups.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
   a memory device comprising a plurality of memory cells, the memory cells being configured to store a data content; and
   a controller being configured to
   write a predefined data pattern into the memory cells of the memory device,
   read the data content of the memory cell,
   map the read data content which corresponds to an expected data content depending on the predefined data pattern to a predefined instruction for the controller, the predefined instruction causing the controller to carry out a predefined action which is representative for an accurate operation of the memory cells,
   determine that the memory device operates accurately, if the controller carries out the predefined action, and
   determine that the memory device does not operate accurately, if the controller does not carry out the predefined action.

2. The integrated circuit according to claim 1, wherein the controller is configured to map the read data content to the predefined instruction such that it comprises interpreting the read data content as an original instruction for the controller and mapping the original instruction to the predefined instruction, if the original instruction fulfills a predefined criterion.

3. The integrated circuit according to claim 1, wherein the predefined instruction causes the controller to increment a counter value.

4. The integrated circuit according to claim 1, wherein the predefined data pattern comprises one of: logical zeros in all memory cells; logical ones in all memory cells; and logical zeros and logical ones alternating over all memory cells.

5. The integrated circuit according to claim 1, wherein each memory cell is configured to store at least one data bit.

6. The integrated circuit according to claim 1, wherein the memory cells are arranged in memory groups, wherein each group of memory cells is configured to store at least one of a data word and a data byte as the data content.

7. The integrated circuit according to claim 6, wherein the determining whether the memory device operates accurately comprises comparing the final counter value with the number of memory cells of the memory device.

8. The integrated circuit according to claim 6, wherein each data word of a memory cell group is formed by the data bits of the memory cells of the respective memory cell group.

9. A chip, comprising: a memory device comprising a plurality of memory cells, and a controller configured to write a test data word corresponding to a predefined data pattern into the memory cells of the memory device, read the data word stored in the memory cells, interpret the read data word as an original instruction for the controller and to map the original instruction to a predefined instruction, if the original instruction corresponds to an expected instruction, execute the predefined instruction when the original instruction is mapped to the predefined instruction, determine that the memory device operates accurately, if the controller executes the predefined instruction, and determine that the memory device does not operate accurately, if the controller does not execute the predefined instruction.

10. The chip according to claim 9, wherein the predefined instruction causes the controller to increment a counter value.

11. The chip according to claim 9, wherein the predefined data pattern comprises one of logical zeros all over the data words, logical ones all over the data words or logical zeros, and logical alternating in each of the data words.

12. The chip according to claim 9, wherein each memory cell is configured to store one data bit.

13. The chip according to claim 12, wherein the memory cells are arranged in memory cell groups, wherein each data word is stored in one of the memory cell groups, and wherein each data word is formed by the data bits of the memory cells of the respective memory cell group.

14. The chip according to claim 13, wherein the predefined instruction causes the controller to increment a counter value, and wherein the determining whether the memory device operates accurately comprises comparing the final counter value with the number of memory cell groups of the memory device.

15. The chip according to claim 9, wherein the data word corresponds to a data byte.

16. A method for testing a memory device of an integrated circuit, wherein the memory device comprises a plurality of memory cells, the method comprising: writing a predefined data pattern into the memory cells of the memory device, reading the data contents of the memory cells, mapping each read data content which corresponds to an expected data content depending on the predefined data pattern to a predefined instruction for a controller, the predefined instruction causing the controller to carry out a predefined action which is representative for an accurate operation of the memory cells, determining that the memory device operates accurately, if the controller carries out the predefined action, and determining that the memory device does not operate accurately, if the controller does not carry out the predefined action.

17. The method according to claim 16, wherein the mapping of the read data content to the predefined instruction comprises interpreting the read data content as an original instruction for the controller and mapping the original instruction to the predefined instruction, if the original instruction fulfills a predefined criterion.

18. The method according to claim 16, wherein for carrying out the predefined action a counter value is incremented.

19. The method according to claim 18, wherein the memory cells are arranged in memory cell groups, wherein one data content is stored in each memory cell group, and wherein the determining whether the memory device operates accurately comprises comparing the final counter value with the number of memory cell groups of the memory device.

20. The method according to claim 16, wherein the writing of the predefined data pattern in the memory cells comprises one of: writing logical zeros in all memory cells, writing logical ones in all memory cells, and writing alternating logical zeros and logical in the memory cells.

21. A method for testing a memory device of a chip, the memory device comprising a plurality of memory cells, the method comprising: writing a test data word corresponding to a predefined data pattern in the memory cells of the memory device, reading the data word stored in the memory cells, interpreting each read data word as an original instruction for a controller and mapping the original instruction to a predefined instruction, if the original instruction corresponds to an expected instruction, executing the predefined instruction each time the original instruction is mapped to the predefined instruction, determining that the memory device operates accurately, if the controller executes the predefined instruction, and determining that the memory device does not operate accurately, if the controller does not execute the predefined instruction.

22. The method according to claim 21, wherein for executing the predefined instruction a counter value is incremented.

23. The method according to claim 21, wherein the memory cells are arranged in memory cell groups, each memory cell group being configured to store a data word, and wherein the determining whether the memory device operates accurately comprises comparing the final counter value with the number of memory cell groups of the memory device.

24. The method according to claim 21, wherein writing the test data words corresponding to the predefined data pattern in the memory cells comprises writing data words only comprising logical zeros in the memory cells, writing data words only comprising logical ones in the memory cells or writing data words comprising alternating logical zeros and logical ones in the memory cells.

25. A method for manufacturing an integrated circuit, comprising: forming a memory device on a substrate, the memory device comprising a plurality of memory cells, and forming a controller on the substrate and configuring the controller such that it is able to write a predefined data pattern in the memory cells of the memory device, read the data contents of the memory cells, map the read data content which corresponds to an expected data content depending on the predefined data pattern to a predefined instruction for the controller, with the predefined instruction causing the controller to carry out a predefined action which is representative for the accurate operation of the memory cells, and determine that the memory device operates accurately, if the controller carries out the predefined action, and determine that the memory device does not operate accurately, if the controller does not carry out the predefined action.

26. A method of manufacturing a chip, the method comprising: forming a memory device on a substrate, the memory device comprising a plurality of memory cells, and configure the memory cells such that they are able to store a data word, and forming a controller on the substrate and configure the controller such that it writes a test data word corresponding to a predefined data pattern in the memory cells of the memory device, reads the data word stored in the memory cells, interprets each read data word as an original instruction for the controller and maps the original instruction to a predefined instruction, if the original instruction corresponds to an expected instruction, executing the predefined instruction each time the original instruction is mapped to the predefined instruction, determines that the memory device operates accurately, if the predefined instruction is executed, and determines that the memory device does not operate accurately, if the predefined instruction is not executed.

* * * * *